(12) United States Patent
Sohn et al.

(10) Patent No.: US 9,190,335 B2
(45) Date of Patent: Nov. 17, 2015

(54) APPARATUS AND METHOD FOR EVALUATING OPTICAL PROPERTIES OF LED AND METHOD FOR MANUFACTURING LED DEVICE

(71) Applicant: SAMSUNG ELECTRONICS CO., LTD., Suwon-si, Gyeonggi-do (KR)

(72) Inventors: Jong Rak Sohn, Gyunggi-do (KR); Il Woo Park, Gyunggi-do (KR)

(73) Assignee: SAMSUNG ELECTRONICS CO., LTD., Seoul (KR)

(*) Notice: Subject to any disclaimer, the term of this patent is extended or adjusted under 35 U.S.C. 154(b) by 0 days.

(21) Appl. No.: 14/057,855

(22) Filed: Oct. 18, 2013

(65) Prior Publication Data

US 2014/0080230 A1   Mar. 20, 2014

Related U.S. Application Data

(62) Division of application No. 13/019,000, filed on Feb. 1, 2011, now abandoned.

(30) Foreign Application Priority Data

Feb. 5, 2010  (KR) .................. 10-2010-0010926
Feb. 5, 2010  (KR) .................. 10-2010-0010927

(51) Int. Cl.
*H01L 21/66* (2006.01)
*H01L 33/50* (2010.01)
(Continued)

(52) U.S. Cl.
CPC . *H01L 22/10* (2013.01); *G01J 1/04* (2013.01); *G01J 3/0251* (2013.01); *H01L 33/50* (2013.01); *G01J 1/0488* (2013.01); *G01J 2001/4252* (2013.01); *H01L 2224/48091* (2013.01)

(58) Field of Classification Search
CPC ......... G01J 1/04; G01J 3/0251; G01J 1/0488; G01J 2001/4252; H01L 22/10; H01L 33/50
USPC ............................................................. 438/7
See application file for complete search history.

(56) References Cited

U.S. PATENT DOCUMENTS 3,935,463 A    1/1976  Jacobsen
20080/297771   12/2008  Ou et al.
(Continued)

FOREIGN PATENT DOCUMENTS

CN    201016843 Y    2/2008
CN    101300687 A    11/2008
(Continued)

OTHER PUBLICATIONS

Taiwanese Office Action with English translation issued in Taiwanese Application No. 100100903 issued Aug. 13, 2013.
(Continued)

*Primary Examiner* — Walter H Swanson
(74) *Attorney, Agent, or Firm* — McDermott Will & Emery LLP

(57) ABSTRACT

An optical property evaluation apparatus includes: a light conversion filter converting light emitted from an LED chip or a bare LED package, which is to be evaluated, into a different wavelength of light, and emitting a specific color of light; and an optical property measurement unit receiving the specific color of light emitted from the light conversion filter and measuring the optical properties of the received light.

18 Claims, 18 Drawing Sheets

(51) Int. Cl.
*G01J 1/04* (2006.01)
*G01J 3/02* (2006.01)
*G01J 1/42* (2006.01)

(56) References Cited

U.S. PATENT DOCUMENTS

| | | |
|---|---|---|
| 2007/0096131 A1 | 5/2007 | Chandra |
| 2008/0001122 A1 | 1/2008 | Odaki et al. |
| 2008/0297771 A1 | 12/2008 | Ou et al. |
| 2009/0021926 A1* | 1/2009 | Wang et al. ............... 362/84 |
| 2009/0286335 A1 | 11/2009 | Le Toquin |
| 2010/0155750 A1 | 6/2010 | Donofrio |

FOREIGN PATENT DOCUMENTS

| | | |
|---|---|---|
| CN | 202119615 U | 1/2012 |
| EP | 2117055 A2 | 11/2009 |
| JP | 2004-119743 A | 4/2004 |
| JP | 2007-66969 | 3/2007 |
| KR | 10-2008-0063104 | 7/2008 |
| KR | 10-2009-0079594 | 7/2009 |
| TW | 200846638 A | 12/2008 |
| WO | 20091118985 A2 | 10/2009 |

OTHER PUBLICATIONS

Extended European Search Report issued in European Application No. 11153302.2 dated May 25, 2011.
Chinese Office Action, w/ English translation thereof, issued in Chinese Patent Application No. CN 201110036162.1 dated Jun. 27, 2013.
Entire Prosecution History of U.S. Appl. No. 13/019,000, filed Feb. 1, 2011 entitled Apparatus and Method for Evaluating Optical Properties of LED and Method for Manufacturing LED Device.

* cited by examiner

APPARATUS AND METHOD FOR EVALUATING OPTICAL PROPERTIES OF LED AND METHOD FOR MANUFACTURING LED DEVICE

CROSS-REFERENCE TO RELATED APPLICATIONS

This application is a Divisional of U.S. application Ser. No. 13/019,000, filed on Feb. 1, 2011, which claims the priorities of Korean Patent Application Nos. 10-2010-0010926 filed on Feb. 5, 2010 and 10-2010-0010927 filed on Feb. 5, 2010, in the Korean Intellectual Property Office, the disclosures of which are incorporated herein by reference.

BACKGROUND OF THE INVENTION

1. Field of the Invention

The present invention relates to an apparatus and method for evaluating the optical properties of a semiconductor light emitting diode (LED), and more particularly, to an apparatus and method for evaluating the optical properties of an LED and a method for manufacturing an LED device.

2. Description of the Related Art

A white LED device, which is currently in the spotlight as a lighting device, is manufactured by combining a blue LED chip or an ultraviolet (UV) LED chip with phosphors which convert the wavelength of light emitted from the LED chip to generate visible light. In order to obtain a target Commission Internationale de l'Eclairage (CIE) chromaticity and a desired optical output when manufacturing such a white LED device, the optical properties of the LED chip and the optical properties of the phosphors should be combined to accurately set output properties including a target CIE chromaticity, a dominant wavelength, an optical output, and a light speed.

To manufacture white LED devices belonging to the same white CIE chromaticity group, the optical properties of LED chips are measured, and the LED chips of which the optical properties are measured to be the same rank depending on a predetermined standard are classified into the same group. The LED chips classified into the same group are mounted on packages, respectively, and a proper amount (or mixing ratio) of phosphor is dispensed around the LED chips to manufacture the white LED devices. Typically, transparent resin including the phosphor is dispensed. For the LED chips classified into another group, a different amount (or mixing ratio) of phosphor may be dispensed. Then, the optical properties of the manufactured white LED devices are measured, and the white LED devices which satisfy target optical efficiency and a target white CIE chromaticity are classified and shipped.

In the above-described processes, the process of measuring the optical properties of the LED chips is referred to as a probing process. Depending on how the optical properties of the LED chips are measured by the probing process and how the LED chips are classified depending on the measurement result, the production yield of the white LED devices may be decided. In general, the optical properties of LED chips having an effect upon the optical properties of white LED devices include a wavelength and an optical output. When the LED chips are classified depending on the optical properties, a dominant wavelength or peak wavelength may be used as the wavelength, and the optical output may be used in unit of mV or mcd. When the LED chips are classified depending on the wavelength and the optical output, the LED chips may be classified in such a manner as to have the correlation with the optical properties of white LED devices which are to be manufactured. However, it is difficult to accurately measure variations in wavelength or optical output depending on viewing angles. Furthermore, when the optical properties of the LED chips are measured, a short wavelength of light such as blue light or UV light is measured. Therefore, the variation of the optical properties is very small. Accordingly, it is very difficult to measure the optical properties of the LED chips such that the optical properties have the correlation with the optical properties of the white LED devices. Hence, although LED chips classified into the same group are used to manufacture white LED devices through the same package process, the white LED devices may exhibit different chromaticities and optical outputs, and some of them may exhibit chromaticities deviating from the target chromaticity range.

An apparatus for measuring the optical properties of an LED according to the related art receives monochromatic light such as blue light or UV light emitted from LED chip and measures the light quantities and wavelengths of the monochromatic light. Depending on the measured light quantities and wavelengths, LED chips having a constant optical property are grouped and classified. However, despite the variations in wavelength, the movement of the chromaticities of blue or UV LED chips used in the white LED devices is much smaller than that of the chromaticities of the white LED devices. Accordingly, although the blue or UV LED chips are classified into the same group depending on the light quantities and wavelengths, the chromaticities of the white LED devices implemented by dispensing phosphor to the LED chips have considerably wide distribution. Light quantity (luminous intensity or optical output) has a close relationship with chromaticity. For example, when a white LED device is implemented by using a blue LED chip and yellow phosphor, the chromaticity of the white LED device differs depending on the ratio of the quantity of blue light to the quantity of yellow light which is obtained from the phosphor by the blue light. Therefore, when a slight difference occurs in the light quantity of the blue light, the chromaticity of the white LED device is varied, and the white light is affected.

Furthermore, due to a deviation between elements of the white LED devices, including an LED chip, a package body, a lead frame, a phosphor, and a sealing agent, a target chromaticity may be not obtained. Therefore, it is difficult to finely control the chromaticity of the white LED device to the target chromaticity by classifying the LED chips through the chip probing. The chromaticity of the white LED device may be affected by the shape of a lead frame, the position of the LED chip inside the package, and the amount of resin sealing agent to be dispensed. However, main factors of the chromaticity distribution of the white LED device may not be discriminated. Accordingly, the cause of the chromaticity distribution may not be properly investigated, and there is a considerable obstacle to improving the production yield of the white LED devices in terms of the chromaticity.

To reduce the chromaticity distribution of white chromaticities, a small number of LED chips may be sampled before phosphor-containing resin is dispensed, that is, before the dispensing process. Then, the dispensing process may be performed on the sampled LED chips to finely control the chromaticity thereof. In this case, since the entire process (curing and so on) after the dispensing process is performed until the chromaticities of the sampled chips reach the target chromaticity, there is a considerable amount of cost and time consumption involved. Furthermore, the target chromaticity is not always guaranteed for the LED chips other than the sampled LED chips.

The combination of monochromatic light emitted from the LED chip and light emitted from the phosphor may generate a specific color of light other than white light. Even when an LED device outputting a specific color of light other than white light is manufactured, it is necessary to realize the target chromaticity, to reduce the chromaticity distribution, and to increase the yield.

SUMMARY OF THE INVENTION

According to an aspect of the present invention, there is provided an optical property evaluation apparatus including: a light conversion filter converting light emitted from an LED chip or a bare LED package, which is to be evaluated, into a different wavelength of light, and emitting a specific color of light; and an optical property measurement unit receiving the specific color of light emitted from the light conversion filter and measuring the optical properties of the received light. The specific color of light emitted from the light conversion filter may include white light.

According to another aspect of the present invention, there is provided an optical property evaluation method including: converting light emitted from an LED chip or a bare LED package, which is to be evaluated, into a different wavelength of light through a light conversion filter, and emitting a specific color of light; and receiving the specific color of light emitted from the light conversion filter, and measuring the optical properties of the received light.

According to another aspect of the present invention, there is provided a method for manufacturing an LED device, including: measuring the optical properties of a specific color of light obtained by converting light emitted from an LED chip through a light conversion filter; and calculating a mixing ratio of phosphor-containing resin to be applied to a resin application process depending on the measured optical properties of the specific color of light emitted from the light conversion filter, based on a preset correlation between the optical properties of the specific color of light emitted from the light conversion filter and the optical properties of the LED device emitting the specific color of light. The specific color of light emitted from the light conversion filter may include white light.

According to another aspect of the present invention, there is provided a method for manufacturing an LED device, including: measuring the optical properties of a specific color of light obtained by converting light emitted from a plurality of LED chips through a light conversion filter; classifying the plurality of LED chips into a plurality of ranks depending on the measured optical properties of the specific color of light emitted from the light conversion filter; and calculating a mixing ratio of phosphor-containing resin corresponding to the LED chips classified into the same rank, based on a preset correlation between the optical properties of the specific color of light emitted from the light conversion filter and the optical properties of the LED device emitting the specific color of light.

According to another aspect of the present invention, there is provided an optical property evaluation method including: applying a voltage to a bare LED bare package which is to be evaluated such that the bare LED package emits light; and receiving the light emitted from the bare LED package, and measuring the chromaticity of the received light.

According to another aspect of the present invention, there is provided a method for manufacturing an LED device, including: preparing a bare LED package; measuring the chromaticity of a specific color of light obtained by converting light emitted from the bare LED package through a light conversion filter; and calculating a mixing ratio of phosphor-containing resin to be applied to a resin application process depending on the measured chromaticity of the specific color of light emitted from the light conversion filter, based on a preset correlation between the chromaticity of the specific color of light emitted from the light conversion filter and the chromaticity of the LED device emitting the specific color of light.

According to another aspect of the present invention, there is provided a method for manufacturing an LED device, including: preparing a bare LED package; measuring the chromaticity of light emitted from the bare LED package; and calculating a mixing ratio of phosphor-containing resin to be applied to a resin application process depending on the measured chromaticity of the light emitted from the bare LED package, based on a preset correlation between the chromaticity of the light emitted from the bare LED package and the chromaticity of the LED device emitting a specific color of light.

In this specification, the bare LED package refers to a package structure in which an LED chip is mounted on a package body and phosphor-containing resin is not yet dispensed. For example, a package structure in which an LED chip is die-bonded to a package body before phosphor-containing resin is dispensed or die-bonding and wire-bonding are completed corresponds to the bare LED package.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
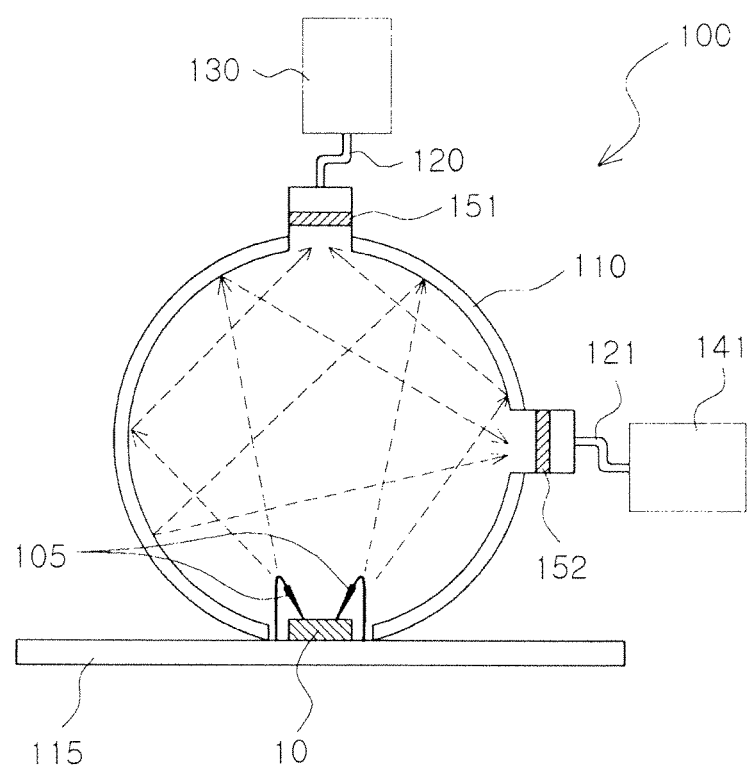
FIG. 1 is a schematic view of an apparatus for evaluating the optical properties of an LED chip according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

FIG. 1 is a diagram schematically illustrating an optical evaluation apparatus for evaluating the optical properties of an LED chip according to an embodiment of the present invention. According to the embodiment of the present invention, white light is emitted through light conversion filters 151 and 152 in a probing operation of the LED chip, and the optical properties of the emitted white light, such as chromaticity, are measured. The chromaticity of the white light obtained through the light conversion filters 151 and 152 may have a clear correlation with the chromaticity of a white LED device which has been manufactured by dispensing a phosphor. The correlation may be used to calculate a proper mixing ratio of phosphor-containing resin from the chromaticity of the white light (obtained through the light conversion filters) which is obtained in the probing operation of the LED chip 10.

Referring to FIG. 1, the optical evaluation apparatus 100 houses the light conversion filters 151 and 152 which convert light emitted from an LED chip 10 which is to be evaluated, or monochromatic light, for example, blue light or UV light, into a different wavelength of light, and emit white light. The white light emitted through the light conversion filters 151 and 152 is received by optical property measurement units to measure the optical properties of the white light. The optical property measurement units may include a photodiode sensor 130 measuring a light quantity (optical power) and a spectrometer 141 measuring a spectrum.

Referring to FIG. 1, the LED chip 10 receives a voltage through probe pins 105 of a probe card 115 and emits monochromatic light, for example, blue light or UV light. The probe card 115 corresponds to a voltage application unit applying a driving voltage to the LED chip 10 or a portion of the voltage application unit. The monochromatic light emitted from the LED chip 10 is reflected by an integrating sphere 110 and concentrated on light reception regions. The integrating sphere 110 has exits for transferring the light to the light reception regions of the optical property measurement units including the photodiode sensor 130 and the spectrometer 141. The light conversion filters 151 and 152 installed in the light reception regions (in particular, the exit openings of the integrating sphere 110) adjacent to the optical property measurement units including the photodiode sensor 130 and the spectrometer 141 converts the light emitted from the LED chip 10 into a different wavelength of light to obtain white light.

The white light obtained through the light conversion filter 151 or 152 is transmitted through an optical cable 120 or 121 to the photodiode sensor 130 or the spectrometer 141 to measure an optical property of the white light such as light quantity or spectrum. The optical property measurement units measure the chromaticity of the white light obtained through the light conversion filters 151 and 152 from the spectrum of the white light obtained by the spectrometer 141. According to the embodiment of the present invention, the light conversion filters are used to measure the chromaticity of the white light converted from the monochromatic light in the optical property measurement operation for the LED chip. Therefore, it is possible to obtain the chromaticity of the white light which is decided by the optical properties of the LED chip in the chip probing operation before a die boning or chip bonding operation or a phosphor dispensing operation.

The chromaticity of the white light obtained through the light conversion filters 151 and 152 has a clear correlation with the chromaticity of a white LED device which has been manufactured by dispensing a phosphor. Based on the correlation between the optical properties (chromaticity and so on) of the white light obtained through the light conversion filters and the optical properties (chromaticity and so on) of the white LED device manufactured by dispensing a phosphor to an LED chip, a mixing ratio of phosphor-containing resin for obtaining a target chromaticity of the white LED device may be calculated from the chromaticity of the white light (obtained through the light conversion filters) which is measured by the above-described optical property evaluation apparatus 100. The mixing ratio may include a ratio of phosphor to transparent resin and a ratio of two or more different phosphors. Furthermore, the correlation may be used to infer the luminance intensity of the white LED device from the optical properties of the white light obtained through the light conversion filters 151 and 152. Since the mixing ratio of the phosphor-containing resin for realizing the target white chromaticity may be more precisely calculated in the chip probing operation (optical property evaluation operation) by using the correlation between the optical properties, it is possible to significantly improve the production yield and productivity of the white LED device.

Depending on the optical properties of the white light obtained through the light conversion filters 151 and 152, LED chips may be classified into a plurality of ranks. This is different from an existing method which classifies the ranks of LED chips depending on the optical properties of light (monochromatic light) emitted from the LED chips. In this embodiment of the present invention, the LED chips may be more precisely classified by using the correlation with the optical properties (chromaticity and so on) of the white LED device. Such classification makes it possible to accurately decide the mixing ratio of phosphor-containing resin for realizing the target chromaticity of the white LED device.

The correlation between the optical properties, which is used for calculating the mixing ratio of phosphor-containing resin for obtaining the target chromaticity of the white LED device or the luminous intensity of the white LED device, may be calculated based on the optical properties of the white light measured by the optical property evaluation apparatus 100 and the optical properties of the white LED device which has been manufactured. For example, the above-described optical property evaluation apparatus 100 may be used to measure the optical properties of white light (obtained through the light conversion filter) for a sufficient number of LED chip samples, and the optical properties of white light emitted from white LED devices which are manufactured by using the LED chip samples and various mixing ratios of phosphor-containing resin may be measured. Then, the optical properties of the two kinds of white light may be compared in order to set the correlation between the optical properties. Based on the correlation between the optical properties of the white light emitted from the light conversion filters and the optical properties of the white light emitted from the white LED device, the mixing ratio of phosphor to transparent resin for obtaining the target chromaticity, the mixing ratio of two or more different phosphors, and the luminous intensity of the white LED device may be calculated or predicted in the chip probing operation.

The light conversion filters 151 and 152 used for converting light emitted from the LED chip into white light during the optical property measurement may be formed of an arbitrary material which is capable of converting a short wavelength of light into a long wavelength of light to obtain white light. In particular, a phosphor which converts monochromatic light emitted from the LED chip, such as blue light or UV light, into a different wavelength of light to obtain white light may be used in the light conversion filters 151 and 152.

Figure 2A:
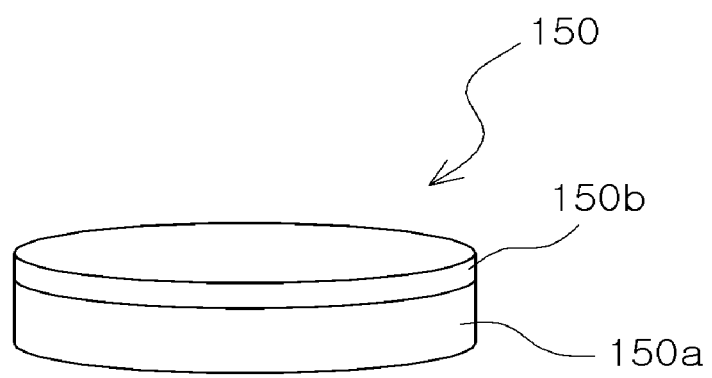
FIGS. 2A and 2B are diagrams illustrating examples of a light conversion filter which may be used in the embodiment of the present invention.
Figure 2B:

FIGS. 2A and 2B are diagrams illustrating examples of the light conversion filter which may be used in the embodiment of the present invention. FIG. 2A illustrates a light conversion filter 150 in which a phosphor layer 150b is uniformly applied onto a transparent substrate 150a such as glass, quartz, or plastic to form a phosphor filter, and FIG. 2B illustrates a phosphor plate or phosphor film 150' which may be used as the above-described light conversion filter formed as a phosphor filter. The phosphor layer 150b and the phosphor plate or phosphor film 150' may be formed of phosphor-containing resin. The phosphor plate or phosphor film 150' may be prepared by the following process. For example, phosphor powder particles may be dispersed in a transparent resin solvent and then cured into a plate or film form.

The light conversion filters 150 and 150' may be used as the light conversion filters 151 and 152 of the optical property evaluation apparatus 100 according to the embodiment of the present invention. For example, when the LED chip 10 to be evaluated is a blue LED chip, the phosphor used in the light conversion filters 150 and 150' may be a yellow phosphor which converts blue light into yellow light. Furthermore, when the LED chip 10 is a blue LED chip, a mixture of a red phosphor and a green phosphor may be used in the light conversion filters 150 and 150'. When the LED chip 10 is a UV LED chip, a mixture of a red phosphor, a green phosphor, and a blue phosphor may be used in the light conversion filters 150 and 150'. The phosphors used in the light conversion filters may include various phosphors such as a garnet-based phosphor, a silicate-based phosphor, a nitride-based phosphor, a sulfide-based phosphor, a halogen compound-based phosphor, an aluminate-based phosphor, and an oxide-based phosphor. In addition, various shapes, combinations, and compositions of phosphors capable of realizing white light may be used in the light conversion filters.

Figure 3:
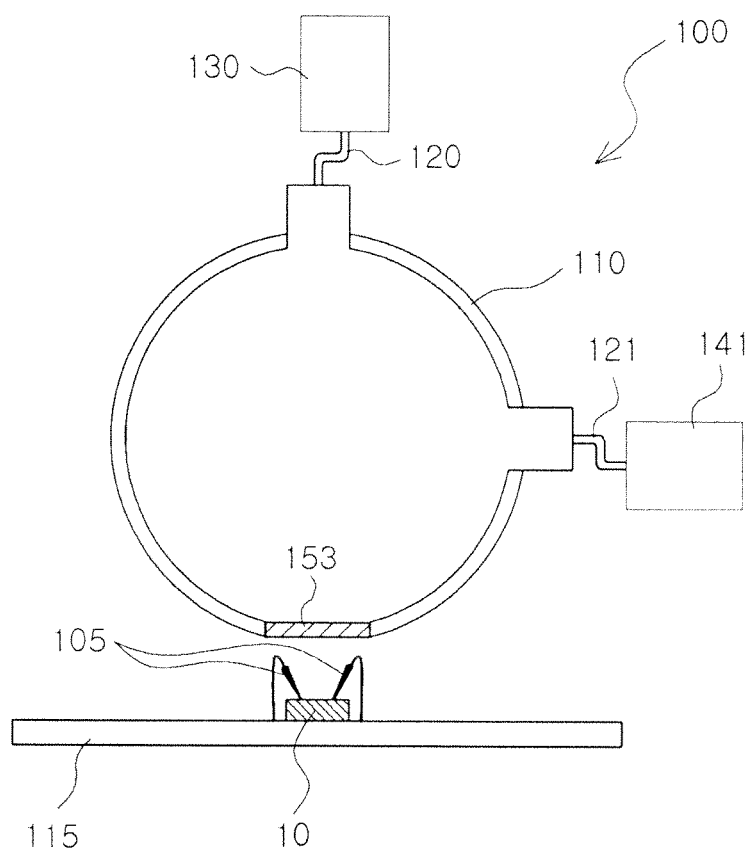
FIG. 3 is a schematic view of an apparatus for evaluating the optical properties of an LED chip according to another embodiment of the present invention.

FIG. 3 is a schematic view of an optical evaluation apparatus for evaluating the optical properties of an LED chip according to another embodiment of the present invention. The optical evaluation apparatus 100' according to the embodiment of the present invention houses a light conversion filter 153 disposed adjacent to a light emission surface of the LED chip 10. The light conversion filter 153 converts the wavelength of light emitted from the LED chip 10. Referring to FIG. 3, when an integrating sphere 10 is used to concentrate light, the light conversion filter 153 may be disposed at an entrance opening of the integrating sphere 110, through which the light emitted from the LED chip 10 is received into the integrating sphere 110. Therefore, white light emitted through the light conversion filter 153 is concentrated by the integrating sphere 110 and enters light reception regions of optical property measurement units including a photodiode sensor 130 and a spectrometer 141 to measure the optical properties of the white light. The other components, functions, and effects are same as those of the above-described embodiment.

Figure 4:
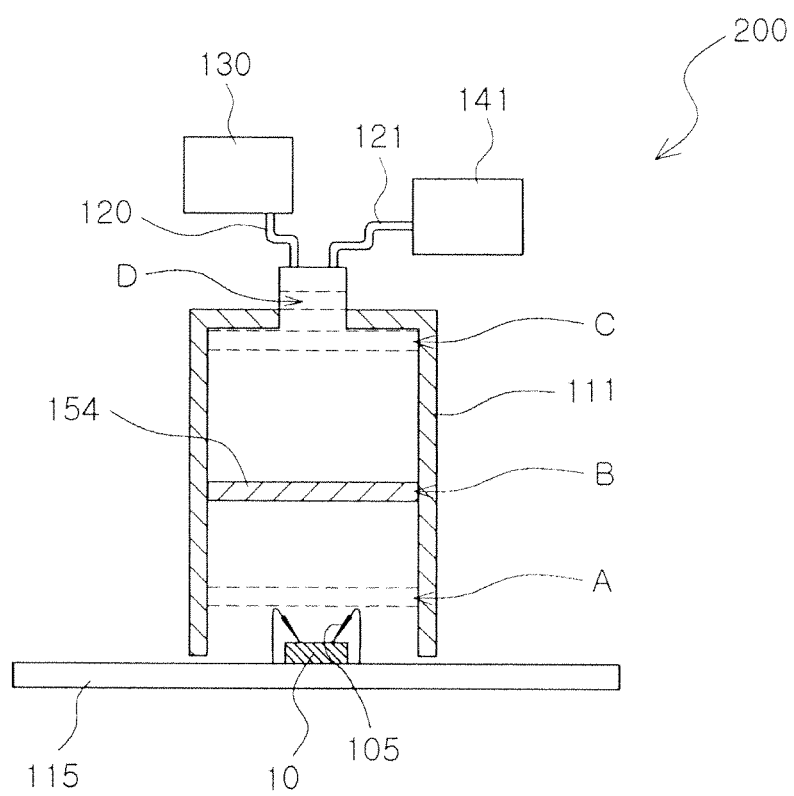
FIG. 4 is a schematic view of an apparatus for evaluating the optical properties of an LED chip according to another embodiment of the present invention.

FIG. 4 is a diagram illustrating an optical evaluation apparatus 200 for evaluating the optical properties of an LED chip according to another embodiment of the present invention. In the above-described embodiments of the present invention, the integrating sphere 110 is used as a light concentration unit for guiding the light emitted from the LED chip 10 or the light conversion filter to the light reception regions of the optical property measurement units (refer to FIGS. 1 and 3). In this embodiment of the present invention, however, a barrel-type light concentrator 111 is used instead of the integrating sphere. The light emitted from the LED chip 10, for example, blue light or UV light, is converted by a light conversion filter 154 housed in the barrel-shaped concentrator 111 of the optical evaluation apparatus 200. Then, white light is emitted from the light conversion filter 154, and enters a light reception region of optical property measurement units including a photodiode sensor 130 and a spectrometer 141. The luminous intensity, spectrum, wavelength, and chromaticity of the white light may be measured by the optical property measurement units.

The light conversion filter 154 may be disposed at various positions. For example, the light conversion filter 154 may be disposed at a central portion B inside the barrel-type light concentrator 111 or an entrance portion A of the barrel-type light concentrator 111. Furthermore, the light conversion filter 154 may be disposed at an exit portion C of the barrel-type light concentrator 111 or the light reception region D of the optical property measurement units. The other components and the functions thereof are the same as those of the above-described embodiments.

Figure 5:
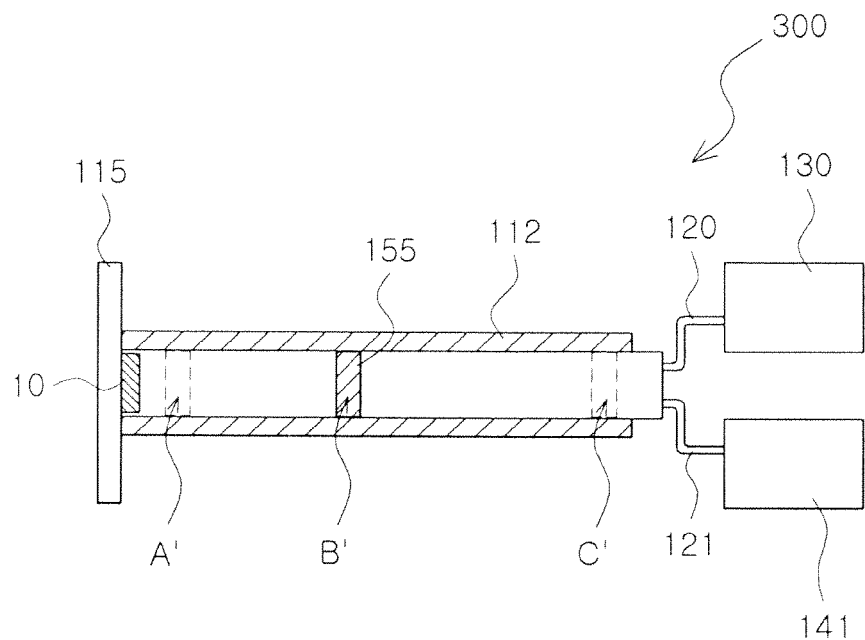
FIG. 5 is a diagram illustrating an apparatus for evaluating the optical properties of an LED chip according to another embodiment of the present invention.

FIG. 5 is a diagram illustrating an optical evaluation apparatus 300 for evaluating the optical properties of an LED chip according to another embodiment of the present invention. Referring to FIG. 5, the optical evaluation apparatus 300 according to the embodiment of the present invention includes a bar-type light concentrator 112 which is used as a light concentration unit for guiding light emitted from the LED chip 10 or a light conversion filter into a light reception region of optical property measurement units, instead of the integrating sphere or the barrel-type light concentrator. The bar-type light concentrator 112 has a narrow internal space. The light emitted from the LED chip 10 is converted by the light conversion filter 155 housed in the optical evaluation apparatus 300. Then, white light is emitted from the light conversion filter 155, and the optical properties of the white light such as a chromaticity are measured by the optical property measurement units including a photodiode sensor 130 and a spectrometer 141. The light conversion filter 155 may be disposed at various positions A', B', and C' inside the bar-type light concentrator 112.

The variety of optical property evaluation apparatuses 100, 100', 200, and 300 according to the embodiments of the present invention may be used to measure the optical properties of light emitted from an LED chip in a white chromaticity region. The measured optical properties of the white light may be compared with the optical properties of a white LED device which has been manufactured by applying phosphor-containing resin to the LED chip. Through the comparison, it is possible to establish or set the correlation between the optical properties of the white light obtained in the chip probing operation and the optical properties of the white LED device. The established correlation may be used for calculating a mixing ratio of phosphor-containing resin which is to be applied to the LED chip to manufacture a white LED device within the target chromaticity range.

Figure 6:
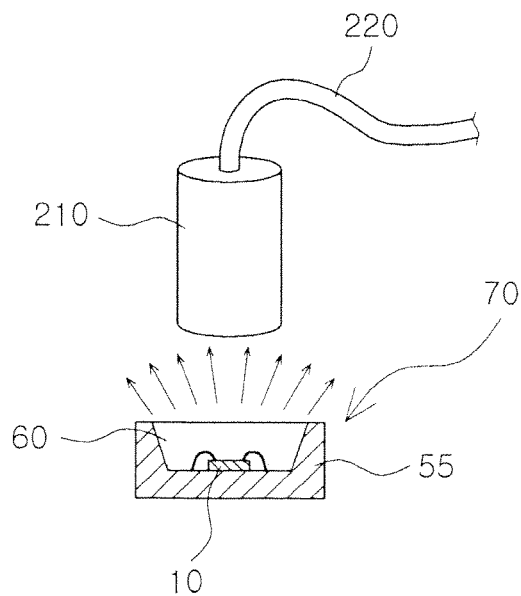
FIG. 6 is a diagram showing a process of evaluating the optical properties of a white LED device including an LED chip and phosphor.

FIG. 6 is a diagram showing a process of evaluating the optical properties of a white LED device 70 which has been manufactured by dispensing phosphor-containing resin 60 to the LED chip 10. The white LED device 70 may be manufactured by the following process. First, the LED chip 10, for example, a blue LED chip is mounted on a package body 55, and wire bonding for electrical connection is performed. Then, phosphor-containing resin, for example, yellow phosphor-containing resin is dispensed around the LED chip 10 and cured. Before the white LED device 70 is manufactured, the optical properties of the LED chip 10 such as chromaticity are measured by the above-described optical property evaluation apparatus 100, 100', 200', or 300. The optical properties of white light emitted from the manufactured white LED device 70 may be measured by a typical optical property measurement apparatus for a white LED device. The white light emitted from the white LED device is transferred to a measurement unit (not shown) through a light reception unit 210 and an optical cable 220 of the optical property measurement apparatus. The optical properties of the white light, such as luminous intensity and chromaticity, may be measured by the measurement unit.

Referring to FIG. 6, the optical properties of the white light emitted from the white LED device which has been manufactured may be compared with the optical properties of the white light (emitted from the light conversion filter) which are measured by the optical property evaluation apparatus 100, 100', 200, or 300 before the white LED device is manufactured. Then, it is possible to establish the correlation data between the optical properties.

Figure 7A:
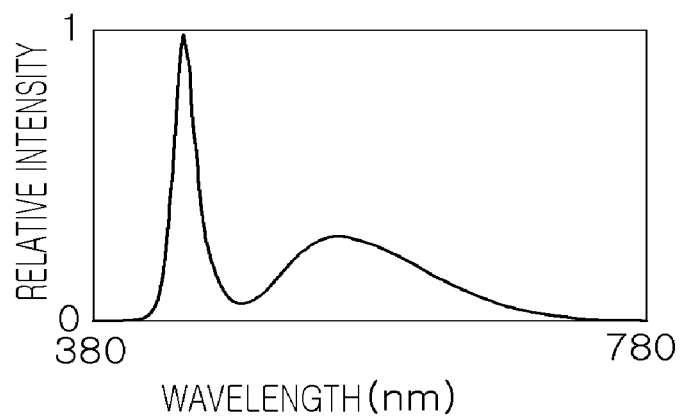
FIGS. 7A and 7B show the spectrum and chromaticity of white light obtained from a light conversion filter according to the embodiment of the present invention.
Figure 7B:
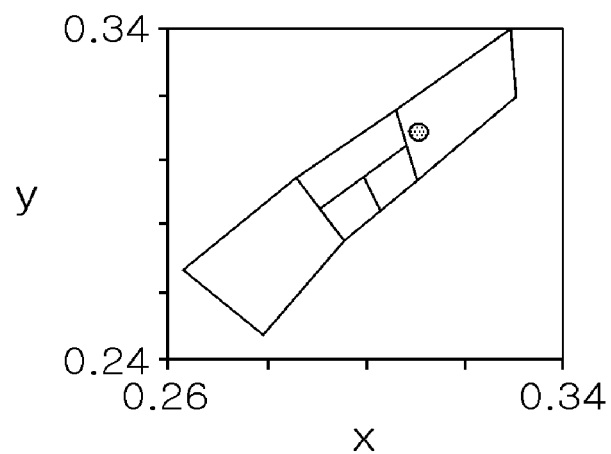
Figure 8A:
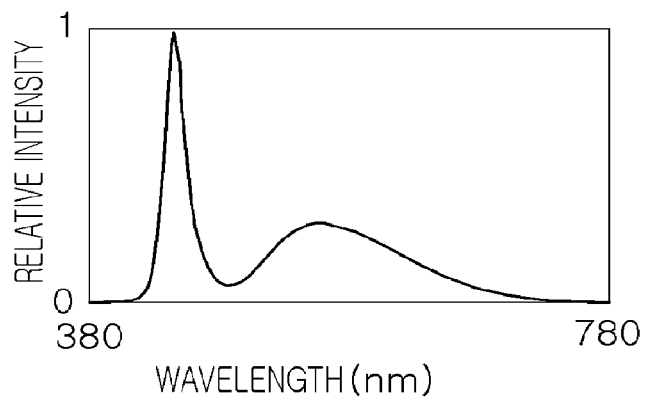
FIGS. 8A and 8B show the spectrum and chromaticity of white light emitted from a white LED device.
Figure 8B:
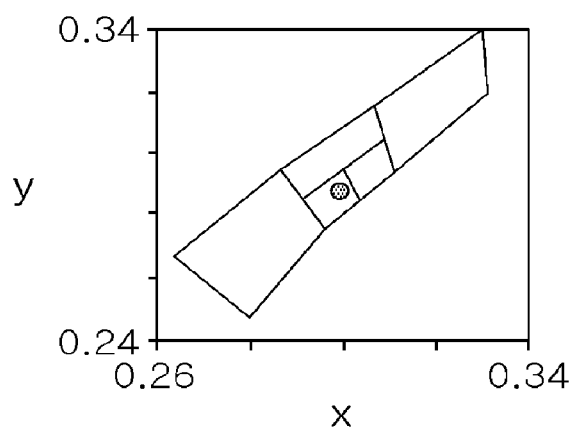

FIGS. 7A and 7B show the spectrum and chromaticity of the white light obtained from the light conversion filter 151, 152, 153, 154, or 155 in the chip probing operation. FIGS. 8A and 8B show the spectrum and chromaticity of the white light emitted from the white LED device manufactured by applying phosphor-containing resin to the LED chip having the properties of FIG. 7. The phosphor-containing resin within the white LED device is prepared at a well-known mixing ratio. A sufficient number of LED chip samples and well-known mixing ratios may be used to compare and analyze the chromaticity of FIG. 7B and the chromaticity of FIG. 8B. Then, it is possible to establish and set the correlation between the chromaticity of the white light obtained from the light conversion filter in the chip probing operation and the chromaticity of the white light obtained from the white LED device, with respect to various mixing ratios. In FIGS. 7B and 8B, ranks depending on chromaticities may be classified into several regions. Based on the rank classification, it is possible to establish the correlation between the chromaticity rank of the white light emitted from the light conversion filter and the chromaticity rank of the white light emitted from the white LED device.

Figure 9:
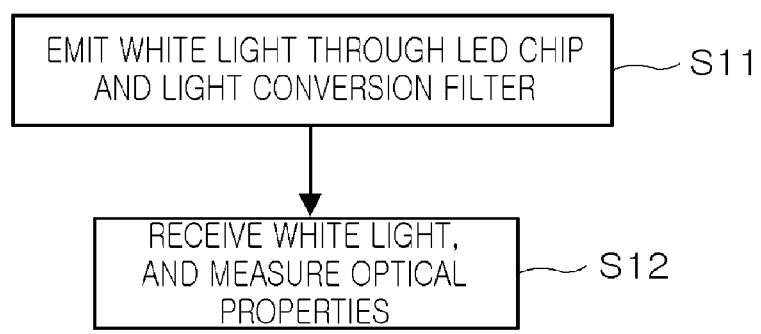
FIG. 9 is a flow chart explaining a method for evaluating the optical properties of an LED chip according to another embodiment of the present invention.

FIG. 9 is a flow chart explaining a method for evaluating the optical properties of an LED chip according to another embodiment of the present invention. The optical property evaluation method may be performed by using the optical property evaluation apparatuses 100, 100", 200', and 300 according to the above-described embodiments of the present invention.

Referring to FIG. 9, light emitted from an LED chip which is to be evaluated is converted by the light conversion filter 151, 152, 153, 154, or 155, and white light is emitted from the light conversion filter (S11). The white light emitted from the light conversion filter enters the light reception region of the optical property measurement unit including a photodiode sensor and a spectrometer, and the optical properties of the white light such as wavelength, luminous intensity, and chromaticity are measured (S12).

The monochromatic light emitted from the LED chip may be guided into the light reception region of the optical property measurement unit through the light concentration unit such as the integrating sphere, the barrel-type light concentrator, or the bar-type light concentrator, before the monochromatic light is converted by the light conversion filter (refer to FIG. 1). Alternatively, the monochromatic light emitted from the LED chip may be converted by the light conversion filter, and the white light emitted from the light conversion filter may be guided into the light reception region of the optical property measurement unit through the light concentration unit such as the integrating sphere, the barrel-type light concentrator, or the bar-type light concentrator (refer to FIG. 3).

In the optical property measurement operation S12, the light quantity of the white light emitted from the light conversion filter may be measured through the photodiode sensor, and the spectrum of the white light may be measured through the spectrometer. Furthermore, the chromaticity of the white light emitted from the light conversion filter may be measured in the optical property measurement operation S12.

The above-described optical property evaluation method may be utilized to manufacture a white LED device at a high production yield and productivity. In particular, the above-described optical property evaluation apparatus or method may be used for manufacturing a white LED device satisfying a target chromaticity at a high yield.

Figure 10:
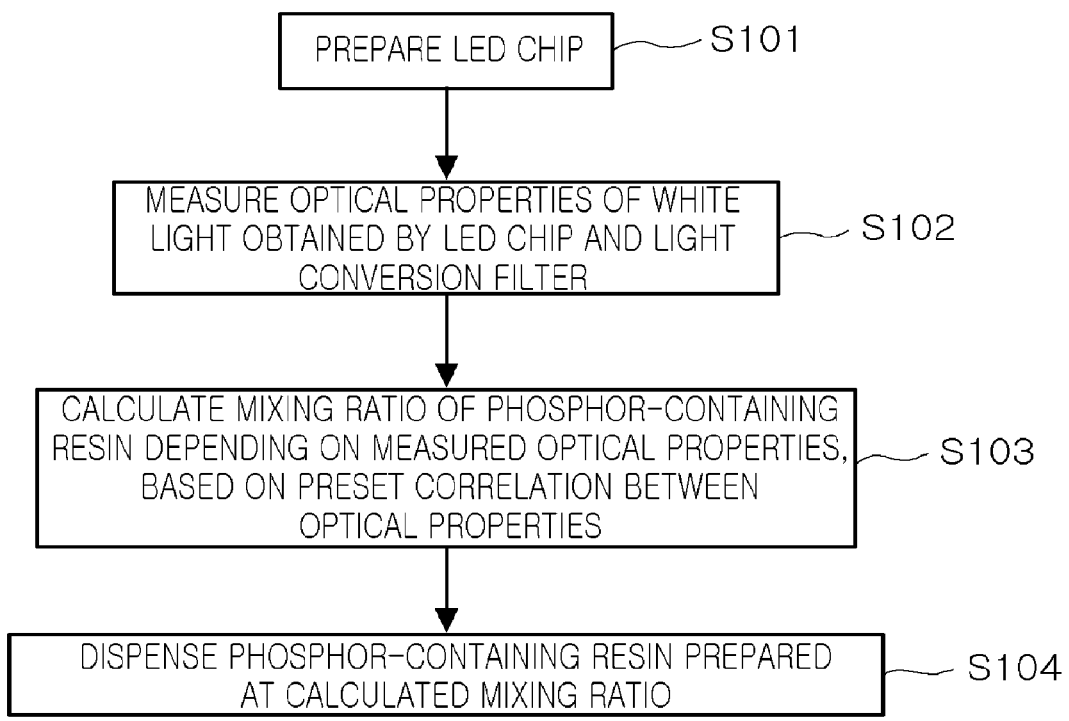
FIG. 10 is a flow chart explaining a method for manufacturing a white LED device according to another embodiment of the present invention.

FIG. 10 is a flow chart explaining a method for manufacturing a white LED device according to another embodiment of the present invention. Referring to FIG. 10, an LED chip is prepared (S101). The LED chip may be a blue LED chip or a UV LED chip. Next, the optical properties of the LED chip are measured in accordance with the above-described optical property evaluation method (refer to FIG. 9) (S102). In the optical property measurement operation S102, light emitted from the LED chip is converted by a light conversion filter. Then, white light is emitted from the light conversion filter, and the optical properties of the white light such as chromaticity and so on are measured.

Subsequently, based on the above-described correlation between the optical properties, that is, the preset correlation between the optical properties of the white light emitted from the light conversion filter and the optical properties of the white light emitted from the white LED device, a mixing ratio of phosphor-containing resin which is to be applied to manufacture the white LED device is calculated from the optical properties measured in operation S102 (S103). In this case, the correlation between the chromaticities, among the correlations between the optical properties, may be used to calculate the mixing ratio of the phosphor-containing resin. That is, based on the preset correlation between the chromaticity of the white light emitted from the light conversion filter and the chromaticity of the white LED device, the mixing ratio of the phosphor-containing resin may be calculated in accordance with the chromaticity of the white light (emitted from the light conversion filter) which is measured in operation S102.

Then, the phosphor-containing resin prepared at the calculated mixing ratio may be dispensed around the LED chip to manufacture the white LED device (S104). Before the phosphor-containing resin is dispensed, a chip bonding operation and a wire bonding operation may be performed, as in a process for manufacturing a typical white LED device.

Figure 11:
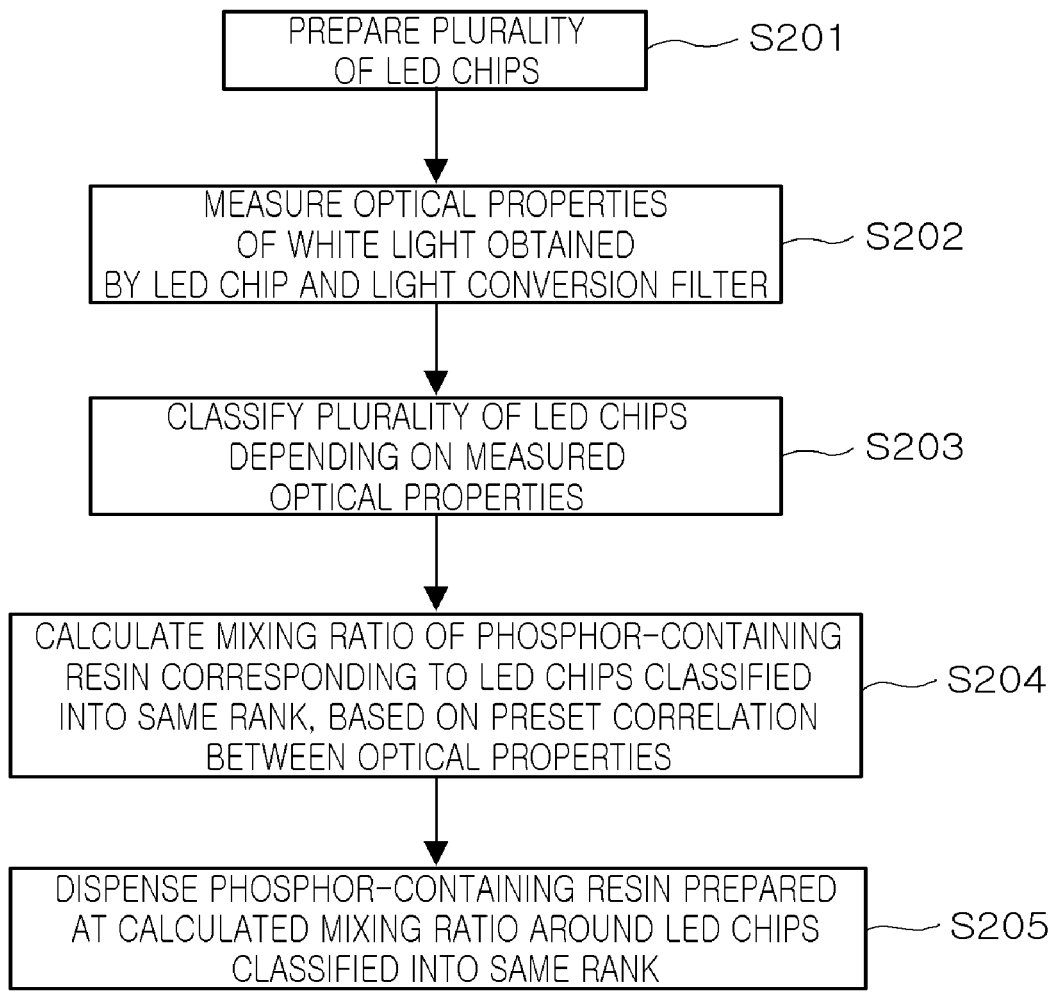
FIG. 11 is a flow chart showing a method for manufacturing a white LED device according to another embodiment of the present invention.

The above-described method for manufacturing the white LED device may additionally include classifying the ranks of the LED chips to manufacture a plurality of white LED devices. FIG. 11 is a flow chart showing a method for manufacturing a white LED device according to another embodiment of the present invention, in which a process for classifying the ranks of LED chips is considered. The ranks of the LED chips may be classified depending on the optical properties of white light emitted from the light conversion filter, rather than the optical properties of monochromatic light emitted from the LED chips.

Referring to FIG. 11, a plurality of LED chips are prepared (S201). Then, the optical properties of white light obtained by the LED chips and the light conversion filter are measured by the above-described optical property evaluation method (S202). Depending on the measured optical properties of the white light, the plurality of LED chips are classified into a plurality of ranks (S203). For example, the ranks of the LED chips may be classified depending on the chromaticities of the white light emitted from the light conversion filter.

Based on the above-described preset correlation between the optical properties, a mixing ratio of phosphor-containing resin corresponding to the LED chips classified in the same rank is calculated (S204). For example, based on the preset correlation between the chromaticity of the white light emitted from the light conversion filter and the chromaticity of the white light emitted from the white LED device, the mixing ratio of phosphor-containing resin may be calculated depending on the ranks of the LED chips. The phosphor-containing resin prepared at the mixing ratio calculated depending on the ranks is dispensed around the LED chips. That is, the phosphor-containing resin prepared at the calculated mixing ratio is dispensed to the LED chips classified into the same rank to manufacture the white LED devices (S205).

When the above-described manufacturing method is used, the optical property ranks of the LED chips may be more precisely classified, and the mixing ratio of the phosphor-containing resin required for realizing the target chromaticity may be more accurately calculated. Accordingly, the production yield of the white LED devices within the target chromaticity increases, and productivity thereof is improved.

In the above-described embodiments, it has been described that white light is emitted from the light conversion filters 150, 150', 151, 152, 153, 154, and 155. Furthermore, the method for manufacturing the white LED device which emits white light by mixing monochromatic light emitted from the LED chip and light emitted from phosphor has been described. However, the embodiments of the present invention are not limited to such cases. That is, the embodiments of the present invention may be also applied to a case in which a specific color of light other than white light is emitted from the light conversion filters 150, 150", 151, 152, 153, 154, and 155. For example, the light conversion filter may be used to convert red light emitted from a red LED chip into a different wavelength of light, and the converted light and the red light may be mixed to finally emit purple light as the mixed light. The chromaticity and/or light quantity of the specific color of light emitted from the light conversion filter may be measured to evaluate the optical properties of LED chips used in specific color LED devices other than the white LED device. Accordingly, the ranks of the LED chips may be classified, which makes it possible to reduce the chromaticity distribution of the specific color LED devices.

According to the above-described embodiments, when the optical properties of an LED chip are measured, the light conversion filter is used to measure a specific color of light such as white light. Therefore, the correlation between the optical properties of the LED chip and the optical properties of a specific color LED device including the LED chip becomes clear. The correlation may be used to more accurately calculate the mixing ratio of phosphor-containing resin for realizing the target chromaticity. Accordingly, the chromaticity distribution of LED devices emitting a specific color of light such as white light may decrease, and the production yield and productivity of the LED devices may increase. Furthermore, in the optical property evaluation operation, a specific color of light, such as white light, is implemented to classify the LED chips. Therefore, when specific color LED devices are manufactured, the chromaticity and brightness of the specific color LED devices may be more accurately predicted to classify the LED chips.

Figure 12:
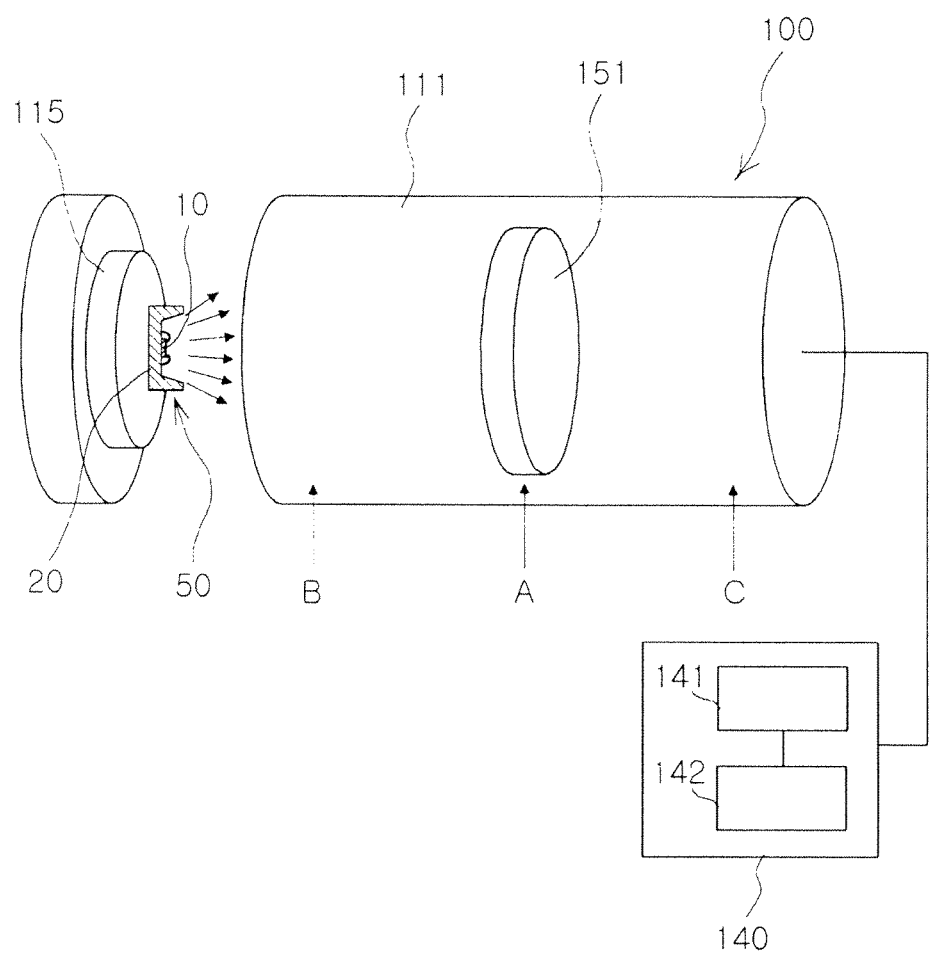
FIG. 12 is a schematic view of an apparatus for evaluating the optical properties of an LED chip according to another embodiment of the present invention.

FIG. 12 is a schematic view of an optical evaluation apparatus for evaluating the optical properties of an LED chip according to another embodiment of the present invention. The optical evaluation apparatus 100 emits white light through a light conversion filter 151, housed in the optical evaluation apparatus 100, during a process of evaluating light emitted from a bare LED package 50, and measures the chromaticity of the emitted white light. The bare LED package 50 refers to a package in which an LED chip 10 is die-bonded to a package body 20 and, if necessary, connected to a lead frame (not shown) of the package body 20 through wire bonding. The bare LED package 50 corresponds to an intermediate product before phosphor-containing resin, for example, a sealing agent having phosphors dispersed therein is dispensed. The package body 20 may include a reflecting cup in which the LED chip 10 is mounted. The chromaticity of white light obtained through a light conversion filter 151 may have a clear correlation with the chromaticity of a white LED device which has been manufactured by dispensing phosphor-containing resin. Based on the correlation, a proper mixing ratio of phosphor-containing resin for realizing a target chromaticity of the white LED device may be calculated from the chromaticity of the white light obtained through the light conversion filter 151.

The optical property evaluation apparatus 100 according to the embodiment of the present invention evaluates the optical properties of the bare package having the LED chip 50 mounted on the package body 20 through the light conversion filter, different from an existing LED chip probing apparatus which evaluates the optical properties of an LED chip. Since the evaluation result of the optical properties of the bare package is used to calculate a proper mixing ratio of phosphor-containing resin to be dispensed when the white LED device is manufactured, it is possible to reduce white chromaticity distribution which is caused by such factors as the position of the LED chip inside the package and the shape of the lead frame.

Referring to FIG. 12, the optical property evaluation apparatus 100 according to the embodiment of the present invention includes a light conversion filter 151 which converts light emitted from the bare LED package 50, for example, blue light or UV light into a different wavelength of light and emits white light. The white light emitted through the light conversion filter 151 is received by an optical property measurement unit 140 to measure the optical properties of the white light such as chromaticity. The optical property measurement unit 140 may include a spectrometer 141 and a calculation unit 142. The spectrometer 141 measures the spectrum of the white light emitted from the light conversion filter 151, and the calculation unit 142 such as a computer calculates a chromaticity from the spectrum information obtained from the spectrometer 141.

Referring to FIG. 12, the bare LED package 50 receives a driving voltage from a probe card 115 such as a driving board, and emits blue light or UV light, for example. The light emitted from the bare LED package 50 enters a barrel-type light concentrator 111. At least some of the light entering the light concentrator 111 may be reflected by the inner wall of the light concentrator 111, and converted into a different wavelength of light by the light conversion filter 151 disposed inside the light concentrator 111. Then, white light is emitted from the light conversion filter 151 to enter the optical property measurement unit 140 through a light reception region. The optical property measurement unit 140 measures the chromaticity of the white light. According to the embodiment of the present invention, the light conversion filter 151 is used in the optical property evaluation operation for the bare LED package to measure the chromaticity of the white light converted from monochromatic light or non-white light. Therefore, it is possible to obtain the chromaticity of the white light, which is decided by the optical properties of the bare LED package 50, in a state of the bare package before the phosphor dispensing.

The white light obtained through the light conversion filter 151 has a clear correlation with the chromaticity of a white LED device which has been manufactured by dispensing phosphors. Based on the correlation between the chromaticity of the white light obtained from the bare LED package 50 through the light conversion filter 151 and the chromaticity of a white LED device 70 (refer to FIG. 17) manufactured by dispensing phosphors to the bare LED package 50, a mixing ratio of phosphor-containing resin for obtaining a target chromaticity of the white LED device may be calculated from the chromaticity of the white light (obtained through the light conversion filter) which is measured by the above-described optical property evaluation apparatus 100. The mixing ratio may include a ratio of phosphor to transparent resin and a ratio of two or more different phosphors. When the above-described correlation between the chromaticities is used, it is possible to more accurately calculate the mixing ratio of phosphor-containing resin in the state of the bare LED package 50. Therefore, it is possible to significantly improve the production yield and productivity of the white LED device. Furthermore, since the bare LED package 50 which is to be evaluated already has the LED chip 10 mounted on the package body 2, the mounting position of the LED chip 10 and the shape of the lead frame do not need to be considered as factors having an effect upon the chromaticity of the white LED device. In an LED chip evaluation operation using an existing chip prober, although it is evaluated that LED chips have the same optical property, considerable deviation may occur in the chromaticities of final white LED devices due to such factors as the shape of lead frames and the mounting position of the LED chips.

Depending on the mixing ratio of phosphor-containing resin dispensed around the LED chip, for example, the ratio of a phosphor to transparent resin or the ratio of two or more different kinds of phosphors, the chromaticity of the white LED device may differ or may be decided. Therefore, the mixing ratio of phosphor-containing resin may serve as an important factor for realizing the target white chromaticity. As described above, the correlation used for calculating the mixing ratio of phosphor-containing resin for obtaining the target white chromaticity of the white LED device may be calculated based on the chromaticity of the white light measured by the above-described optical property evaluation apparatus and the chromaticity measured in the white LED device.

For example, the above-described optical property evaluation apparatus 100 may be used to measure the chromaticities of white light obtained from a sufficient number of bare LED package samples through the light conversion filter, and the chromaticities of white light emitted from white LED devices manufactured by using the bare LED package samples and various mixing ratios of phosphor-containing resin. Then, the chromaticities of two kinds of white light may be compared to set the correlation between the chromaticities. The correlation set in such a manner, that is, the correlation between the chromaticity of the white light emitted from the light conversion filter and the chromaticity of the white light emitted from the white LED device may be used to calculate or predict the mixing ratio of phosphor to transparent resin for obtaining the target white chromaticity and the mixing ratio of two or more different phosphors in the bare LED package evaluation operation.

As the light conversion filter 151 used for converting the light emitted from the bare LED package 50 into white light, an arbitrary material capable of converting a short wavelength of light into a long wavelength of light to emit white light may be used. In particular, a phosphor material which converts monochromatic light emitted from the bare LED package 50, such as blue light or UV light, into a different wavelength of light to emit white light may be used in the light conversion filter 151.

The light conversion filter 151 may be disposed at any position inside the barrel-type light concentrator 111, FIG. 12 illustrates a state in which the light conversion filter 151 is disposed in a central portion A of the light concentrator 111. However, the light conversion filter 151 may be disposed at an entrance B of the light concentrator 111 or at an exit C of the light concentrator 111, that is, in the vicinity of the light reception region C of the optical property measurement unit 140.

Figure 13A:
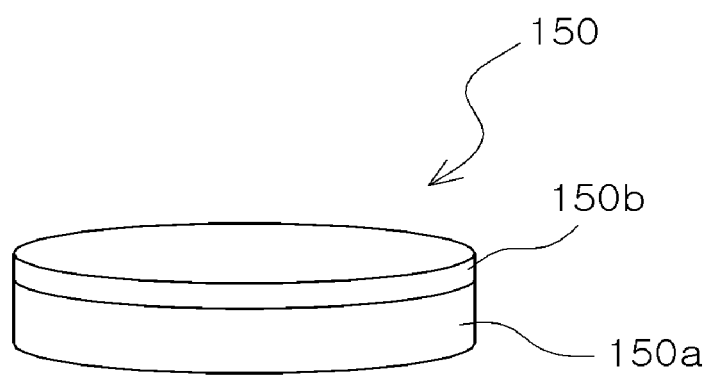
FIGS. 13A and 13B are diagrams illustrating examples of a light conversion filter which may be used in this embodiment of the present invention.
Figure 13B:

FIGS. 13A and 13B are diagrams illustrating examples of the light conversion filter which may be used in this embodiment of the present invention. Referring to FIG. 13A, a light conversion filter 150 formed as a phosphor filter may include a transparent substrate 150a such as glass, quartz, or plastic and a phosphor layer 150b which is uniformly applied on the transparent substrate 150a. Referring to FIG. 13B, a phosphor plate or phosphor film 150' may be used as the above-described light conversion filter formed as a phosphor filter. The phosphor layer 150b or the phosphor plate or phosphor film 150' may be formed of phosphor-containing resin. The phosphor plate or phosphor film 150' may be prepared by the following process. For example, phosphor powder particles may be dispersed in a transparent resin solvent and then cured into a plate or film form.

The light conversion filters 150 and 150' may be used as the light conversion filter 151 of the optical property evaluation apparatus 100 according to the embodiment of the present invention. For example, when the LED chip 10 mounted in the bare LED package 50 to be evaluated is a blue LED chip, the phosphor used in the light conversion filters 150 and 150' may be a yellow phosphor which converts blue light into yellow light. Furthermore, when the LED chip 10 inside the bare LED package 50 is a blue LED chip, a mixture of a red phosphor and a green phosphor may be used in the light conversion filters 150 and 150'. When the LED chip 10 inside the bare LED package 50 is a UV LED chip, a mixture of a red phosphor, a green phosphor, and a blue phosphor may be used in the light conversion filters 150 and 150'. The phosphors used in the light conversion filters may include various phosphors such as a garnet-based phosphor, a silicate-based phosphor, a nitride-based phosphor, a sulfide-based phosphor, a halogen compound-based phosphor, an aluminate-based phosphor, and an oxide-based phosphor. In addition, various shapes, combinations, and compositions of phosphors capable of realizing white light may be used as the light conversion filters.

Figure 14:
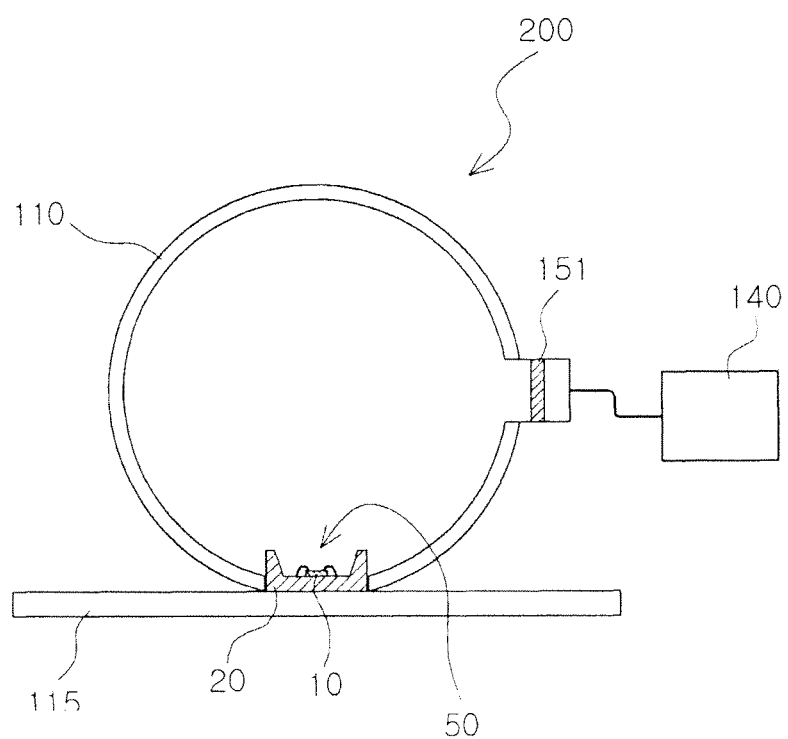
FIG. 14 is a schematic view of an apparatus for evaluating the optical properties of an LED chip according to another embodiment of the present invention.

FIG. 14 is a schematic view of an optical evaluation apparatus for evaluating the optical properties of an LED according to another embodiment of the present invention. The optical evaluation apparatus according to the embodiment of the present invention includes an integrating sphere 110 as a light concentrator which guides light emitted from a bare LED package 50 or white light emitted from a light conversion filter to a light reception region of an optical property measurement unit 140, instead of the above-described barrel-type light concentrator 12 (refer to FIG. 12). The integrating sphere 110 includes an inner wall having a reflecting surface capable of reflecting light. The integrating sphere 110 has an exit for transferring light to the light reception region of the optical property measurement unit 140.

Referring to FIG. 14, the light emitted from the bare LED package 50, for example, blue light or UV light, is reflected by the integrating sphere 111 and concentrated in the light reception region of the optical property measurement unit 140. The light conversion filter 140 is housed in the optical evaluation apparatus and is installed in the vicinity of the light reception region of the optical property measurement unit 140. The light conversion filter 140 converts the light concentrated on the light reception region into a different wavelength of light to emit white light. The white light obtained through the light conversion filter 151 enters the spectrometer of the optical property measurement unit 140 through an optical cable, for example, and the chromaticity of the white light obtained through the light conversion filter 151 is measured. The other components such as the probe card 115 and the functions thereof are the same as those of the above-described embodiment (refer to FIG. 12).

Figure 15:
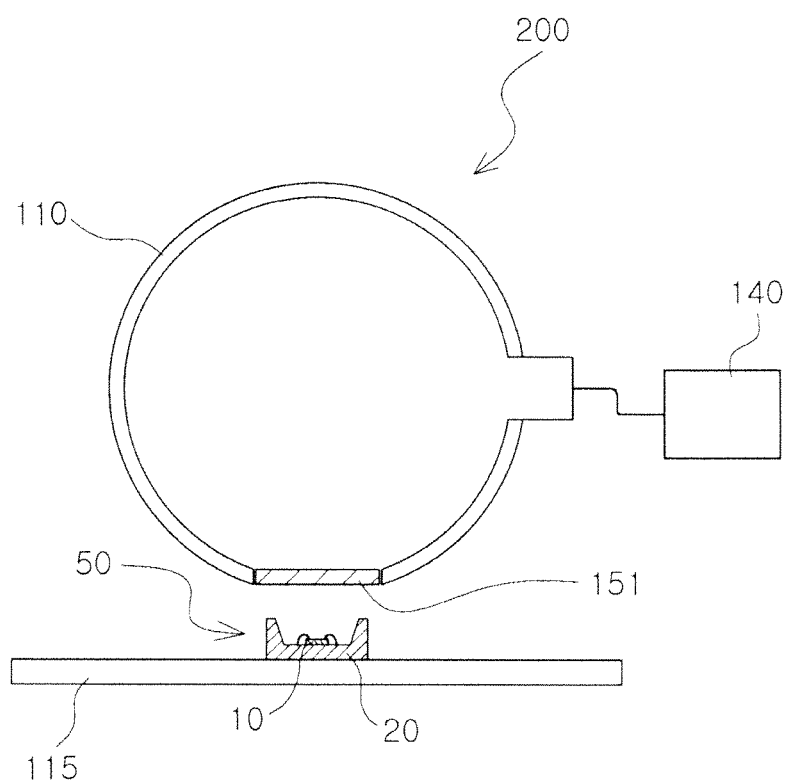
FIG. 15 is a schematic view of an apparatus for evaluating the optical properties of an LED chip according to another embodiment of the present invention.

FIG. 15 is a schematic view of an optical evaluation apparatus for evaluating the optical properties of an LED according to another embodiment of the present invention. In this embodiment of the present invention, the integrating sphere 110 is used to concentrate light on the light reception region of the optical property measurement unit 140, as in the embodiment of FIG. 14. In this embodiment, however, the light conversion filter 151 converting the wavelength of light emitted from the bare package 50 is housed in the optical evaluation apparatus and is disposed adjacent to the light emission surface of the bare LED package 50. Referring to FIG. 15, the light conversion filter 151 may be disposed at an entrance opening of the integrating sphere 110 for introducing the light emitted from the bare LED package 50 into the integrating sphere 110. Therefore, the white light emitted through the light conversion filter 151 is concentrated by the integrating sphere 110, and enters the light reception region of the optical property measurement unit to measure the chromaticity of the white light. The other components and the functions thereof are the same as those of the above-described embodiment.

Figure 16:
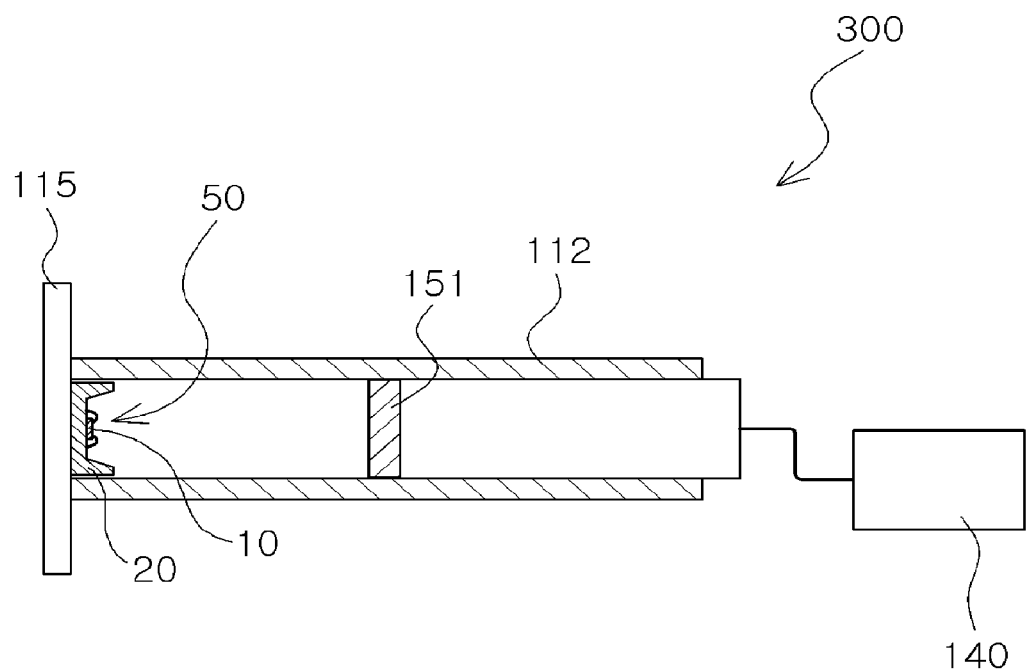
FIG. 16 is a diagram illustrating an apparatus for evaluating the optical properties of an LED chip according to another embodiment of the present invention.

FIG. 16 is a diagram illustrating an optical evaluation apparatus for evaluating the optical properties of an LED according to another embodiment of the present invention. Referring to FIG. 16, the optical property evaluation apparatus according to the embodiment of the present invention includes a bar-type light concentrator 112 having a narrow internal space as a light concentration unit for guiding light emitted from the bare LED package 50 or the light emitted from the light conversion filter 151 into the light reception region of the optical property measurement unit 140, instead of the integrating sphere or the barrel-type light concentrator. The light emitted from the bare LED package 50 is converted by the light conversion filter 151 housed in the optical evaluation apparatus, and white light is emitted from the light conversion filter 151. The optical property measurement unit 140 measures the chromaticity of the white light. The light conversion filter 151 may be disposed at various positions inside the bar-type light concentrator 112.

The optical property evaluation apparatuses 100, 200, 200', and 300 according to the above-described embodiments of the present invention may be used to measure the chromaticity of the bare LED package in the white chromaticity region. The measured white chromaticity may be compared with the chromaticity of a white LED device which has been manufactured by dispensing phosphor-containing resin to the LED chip 10 inside the bare LED package 50. Through the comparison, it is possible to establish or set the correlation between the chromaticity of the white light obtained through the light conversion filter in the operation of evaluating the optical properties of the bare LED package and the chromaticity of the white LED device which actually has been manufactured by dispensing phosphor-containing resin to the LED chip 10 mounted on the bare LED package 50. The established correlation may be used for calculating a mixing ratio of phosphor-containing resin which is to be applied to the LED chip 10 mounted on the bare LED package 50 to manufacture white LED devices within the target chromaticity range.

Figure 17:
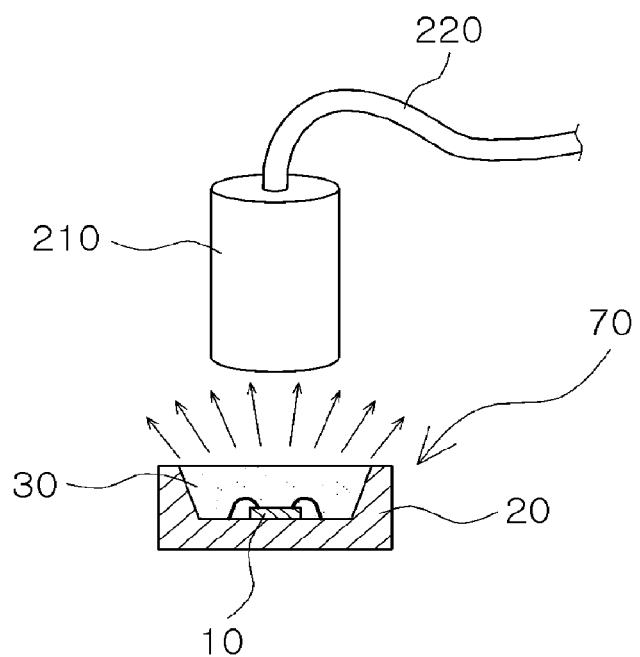
FIG. 17 is a diagram showing a process of evaluating the optical properties of a white LED device including an LED chip and phosphor.

FIG. 17 is a diagram showing a process of evaluating the optical properties of a white LED device 70 which actually has been manufactured by dispensing phosphor-containing resin to the LED chip 10. The white LED device 70 may be manufactured by the following process. First, the LED chip 10, for example, a blue LED chip is die-bonded to a package body 20, and wire bonding is performed to manufacture a bare LED package. Then, phosphor-containing resin 30, for example, yellow phosphor-containing resin, is dispensed around the LED chip 10 and then cured. In this case, the phosphor-containing resin 30 may be dispensed to a reflecting cup of the package body 20 to seal the LED chip 10.

Before the phosphor-containing resin is dispensed, the chromaticity of the bare LED package is measured by the above-described optical property evaluation apparatus 100, 100', 200', or 300. The chromaticity of white light emitted from the manufactured white LED device 70 may be measured by a typical optical property measurement apparatus for a white LED device. The white light emitted from the white LED device 70 may be transferred to a measurement unit (not shown) through a light reception unit 210 and an optical cable 220 of the optical property measurement apparatus to measure the chromaticity of the white light. The chromaticity of the white light of the white LED device 70 to which the phosphor-containing resin has been dispensed may be compared with the chromaticity of the white light (emitted from the light conversion filter) which is measured by the optical property evaluation apparatus 100, 200, 200'', or 300, in order to set the correction data between the chromaticities.

Figure 18A:
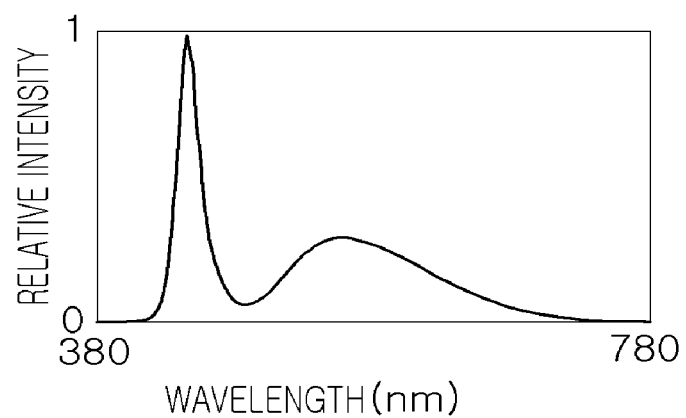
FIGS. 18A and 18B show the spectrum and chromaticity of white light obtained from a light conversion filter according to the embodiment of the present invention.
Figure 18B:
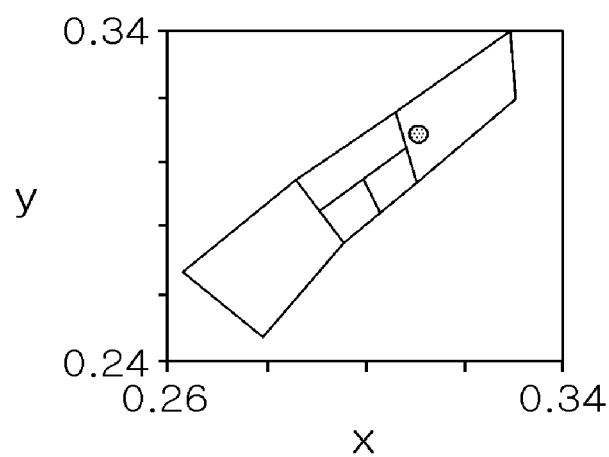
Figure 19A:
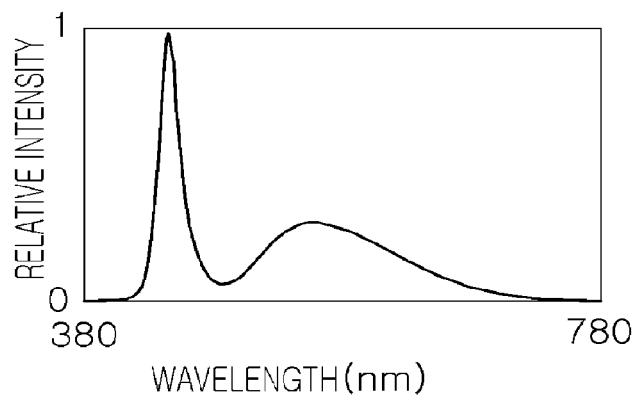
FIGS. 19A and 19B show the spectrum and chromaticity of white light emitted from a white LED device.
Figure 19B:
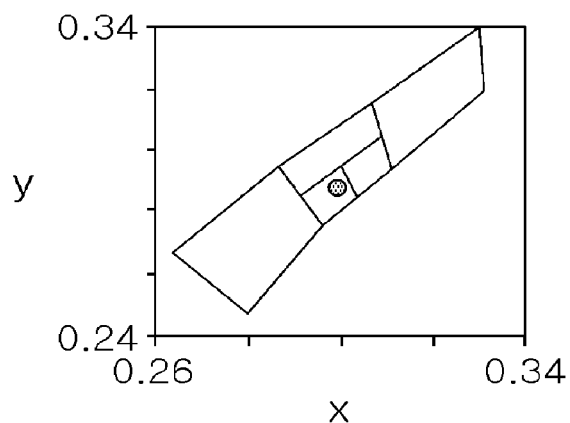

FIGS. 18A and 18B show the spectrum and chromaticity of the white light obtained from the light conversion filter 151 in the optical property evaluation operation for the bare LED package. The chromaticity is represented by a chromaticity of the CIE 1931 chromaticity system. FIGS. 19A and 19B show the spectrum and chromaticity of the white light emitted from the white LED device manufactured by applying phosphor-containing resin to the LED chip mounted on the bare LED package having the properties of FIGS. 18A and 18B. The phosphor-containing resin within the white LED device is prepared at a well-known mixing ratio. A sufficient number of LED chip samples and well-known mixing ratios may be used to compare and analyze the chromaticity of the white light obtained through the light conversion filter and the chromaticity of the white LED device. Then, it is possible to establish and set the correlation between the chromaticity of the white light obtained from the light conversion filter in the chip probing operation and the chromaticity of the white light obtained from the white LED device, with respect to various mixing ratios. In FIGS. 18B and 19B, ranks depending on the chromaticities may be classified into several regions. Based on the rank classification, it is possible to establish the correlation between the chromaticity rank of the white light emitted from the light conversion filter and the chromaticity rank of the white light emitted from the white LED device. At this time, the mean or median value of a proper number of chromaticities corresponding to each rank may be set as a representative value of the rank.

Figure 20:
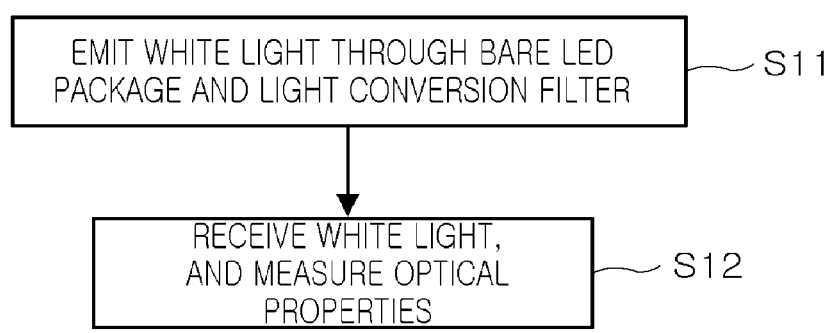
FIG. 20 is a flow chart explaining a method for evaluating the optical properties of an LED chip according to another embodiment of the present invention.

FIG. 20 is a flow chart explaining a method for evaluating the optical properties of an LED chip according to another embodiment of the present invention. The optical property evaluation method may be performed by using the optical property evaluation apparatuses 100, 100', 200', and 300 according to the above-described embodiments of the present invention.

Referring to FIG. 20, light emitted from a bare LED package 50 which is to be evaluated is converted by the light conversion filter 151, and white light is emitted from the light conversion filter 151 (S11). The white light emitted from the light conversion filter 151 enters the light reception region of the optical property measurement unit 140 to measure the chromaticity of the white light (S12). The light emitted from the bare LED package 50 or the white light emitted from the light conversion filter 151 may be guided to the light reception region of the optical property measurement unit 140 through the light concentrator such as the integrating sphere, the barrel-type light concentrator, or the bar-type light concentrator.

The above-described optical property evaluation method may be utilized to manufacture white LED devices at a high production yield and productivity. In particular, the optical property evaluation method may be used for manufacturing white LED devices satisfying a target chromaticity at a high yield.

Figure 21:
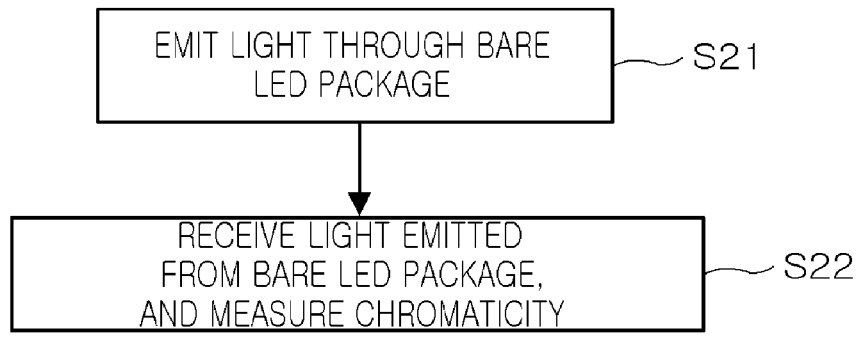
FIG. 21 is a flow chart explaining a method for evaluating the optical properties of an LED according to another embodiment of the present invention.

FIG. 21 is a flow chart explaining a method for evaluating the optical properties of an LED according to another embodiment of the present invention. The optical property evaluation method may be performed by using the optical property evaluation apparatuses 100, 100', 200', and 300 according to the above-described embodiments of the present invention, excluding the light conversion filter 151.

Referring to FIG. 21, when a driving voltage is applied to a bare LED package 50 which is to be evaluated, the LED package bare package 50 emits light, for example, blue light or UV light (S21). The light (non-white light) emitted from the bare LED package 50 is received to measure the chromaticity of the light (S22). During the chromaticity measurement, the above-described barrel-type or bar-type light concentrator or the integrating sphere may be used to concentrate light on the light reception region of the optical property measurement unit 140. In this embodiment, although the chromaticity of the light emitted from the bare LED package 50 is measured without a light conversion filter, the measured chromaticity of the bare LED package is not always identical to the chromaticity of light emitted from the LED chip without the bare package. The chromaticity of the LED chip measured by using a chip prober is not a chromaticity obtained by reflecting package elements such as a package body, a lead frame, and a bonding wire, but the chromaticity of the bare LED package obtained in the embodiment of FIG. 21 may be a chromaticity obtained by reflecting at least some of the package elements excluding phosphor-containing resin. For example, when the bare LED package 50 includes a package body, a lead frame, and a bonding wire, the chromaticity of the bare LED package may be obtained by reflecting the effects caused by the package elements excluding the phosphor-containing resin. Furthermore, when the bonding wire is omitted as in the flip-chip bonding operation or before the bonding wire is formed, the chromaticity of the bare LED package may be obtained by reflecting the effects caused by the package body and the lead frame.

Although a plurality of white LED devices are manufactured by applying phosphor-containing resin prepared at the same mixing ratio to a plurality of LED chips having the same chromaticity, the plurality of white LED devices may have considerable chromaticity distribution due to the deviation between the package elements. However, the chromaticity of the bare LED package measured according to the method of FIG. 21 is obtained by reflecting the effects caused by at least some of package elements such as a package body, a lead frame, and a bonding wire, excluding phosphor-containing resin. Therefore, white LED devices manufactured by applying phosphor-containing resin prepared at the same mixing ratio to bare LED packages having the same chromaticity may exhibit reduced chromaticity distribution.

The optical property evaluation methods of FIGS. 20 and 21 may not only be used in a method for manufacturing a white LED device, but may also be utilized for analyzing and investigating the cause of the chromaticity distribution of the white LED devices. For example, the chromaticity measured in operation S12 or S22 and the chromaticity of the white LED device which has been manufactured may be compared, or the wavelengths, outputs, and luminances of the LED chip and the white LED device may be compared to analyze the cause of the chromaticity distribution.

Figure 22:
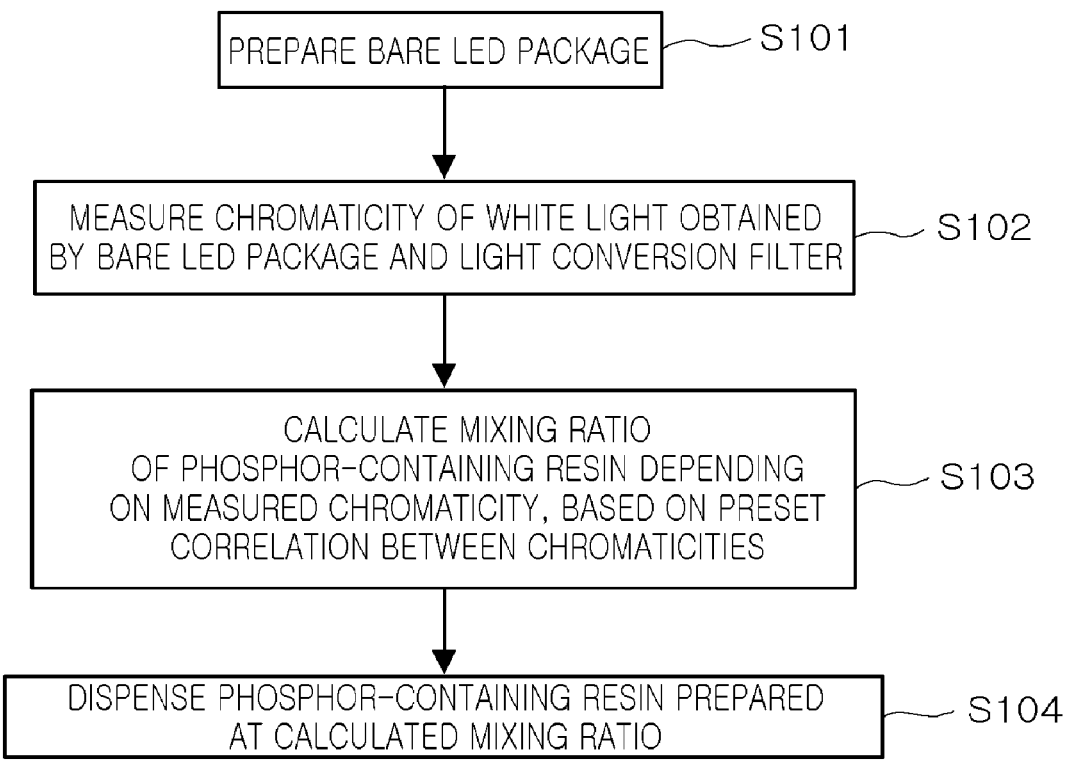
FIG. 22 is a flow chart explaining a method for manufacturing a white LED device according to another embodiment of the present invention.

FIG. 22 is a flow chart explaining a method for manufacturing a white LED device according to another embodiment of the present invention. Referring to FIG. 22, a bare LED package is prepared (S101). The bare LED package may include a blue LED chip or a UV LED chip. Next, the chromaticity of white light is measured in accordance with the optical property evaluation method using the light conversion filter (refer to FIG. 20) (S102). In the chromaticity measurement operation S102, the chromaticity of the white light obtained by converting light emitted from the bare LED package through the light conversion filter is measured.

Then, the above-described correlation between the chromaticities, that is, the preset correlation between the chromaticity of the white light emitted from the light conversion filter and the chromaticity of the white light emitted from the white LED device is used to calculate a mixing ratio of phosphor-containing resin which is to be applied to the bare package to realize a target chromaticity, from the chromaticity measured in operation S102 (S103). Subsequently, phosphor-containing resin prepared at the calculated mixing ratio is dispensed around the LED chip of the bare LED package to manufacture a white LED device (S104). When the above-described method for manufacturing a white LED device is used, it is possible to more accurately calculate the mixing ratio of phosphor-containing resin required for realizing the target chromaticity. Accordingly, the production yield of white LED devices satisfying the target chromaticity increases, and productivity thereof is improved.

Figure 23:
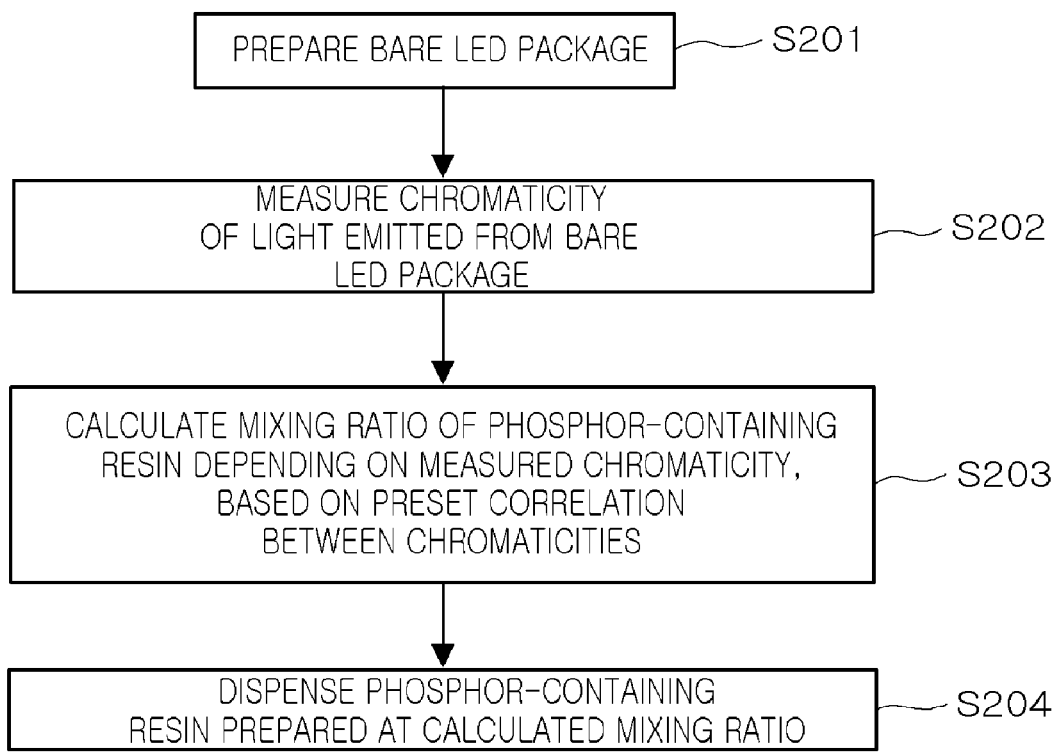
FIG. 23 is a flow chart explaining a method for manufacturing a white LED device according to another embodiment of the present invention.

FIG. 23 is a flow chart explaining a method for manufacturing a white LED device according to another embodiment of the present invention. In this embodiment, the chromaticity of light emitted from a bare LED package is measured without using a light conversion filter, and a mixing ratio of phosphor-containing resin is calculated depending on the measured chromaticity.

Referring to FIG. 23, a bare LED package is prepared (S201). Next, the chromaticity of light emitted from the bare LED package is measured in accordance with the method of FIG. 21 (S202). As described above, the chromaticity of the bare LED package may be considered to be a chromaticity obtained by reflecting the effects of package elements such as a package body, a lead frame, and a bonding wire.

Subsequently, based on the correlation between the chromaticity (non-white color) of the bare LED package and the chromaticity (white) of the white LED device manufactured by dispensing phosphor-containing resin to the bare LED package, a mixing ratio of phosphor-containing resin for realizing a target chromaticity is calculated from the chromaticity of the bare LED package measured in operation S202 (S203). Then, the phosphor-containing resin prepared at the calculated mixing ratio is dispensed around the LED chip of the bare LED package to manufacture a white LED device (S204). When the method for manufacturing a white LED device is used, it is possible to reduce the chromaticity distribution of white LED devices caused by such factors as the optical properties of LED chips, the shapes of lead frames, and the positions of the LED chips. Therefore, the production yield and productivity of white LED devices satisfying the target chromaticity may be improved.

In the above-described embodiments, it has been described that white light is emitted from the light conversion filter 150, 150, or 151. Furthermore, the method for manufacturing the white LED device which emits white light by mixing monochromatic light emitted from the LED chip and light emitted from the phosphors has been described. However, the embodiments of the present invention are not limited only to a case in which white light is emitted by the light conversion filter or the white LED device is manufactured. The embodiments of the present invention may be applied to a case in which a non-white LED device is manufactured or the optical properties of a bare LED package to be applied to the non-white LED device are measured.

For example, a light conversion filter may be used to convert red light emitted from a bare LED package having a red LED chip mounted thereon into a different wavelength of light, and the converted light and the red light may be mixed to finally emit purple light as the mixed light. As the chromaticity of a specific color of light other than the white light emitted from the light conversion filter is measured, it is possible to evaluate the optical properties of LED chips used in the specific color LED devices. Accordingly, it is possible to reduce a chromaticity distribution of the specific color LED devices.

In the above-described embodiments of the present invention, the chromaticity of a specific color LED device such as the white LED device manufactured by dispensing phosphor-containing resin to the bare LED package may be optimized in accordance with the target chromaticity. Furthermore, since the correlation between the chromaticities may be used to accurately calculate the mixing ratio of phosphor-containing resin for realizing the target chromaticity, it is possible to omit a dispensing process which is previously performed on separate LED samples. Accordingly, the chromaticity distribution of final specific color LED devices is reduced, and the production yield and productivity thereof increases. Furthermore, the optical property evaluation apparatus and method may be used to effectively analyze the cause of the chromaticity distribution of the specific color LED devices.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for manufacturing an LED device, comprising:
   measuring at least one optical property of a specific color of light obtained by converting light emitted from each respective LED chip of a plurality of LED chips through one same light conversion filter of an optical evaluation apparatus;
   classifying each respective LED chip of the plurality of LED chips into a plurality of ranks depending on the at least one measured optical property of the specific color of light emitted from the light conversion filter when illuminated by the respective LED chip; and
   calculating a mixing ratio of phosphor-containing resin corresponding to the LED chips classified into a same rank of the plurality of ranks, based on a preset correlation between the at least one optical property of the specific color of light emitted from the light conversion filter when illuminated by the LED chips classified into the same rank and an optical property of a typical LED device emitting the specific color of light,
   wherein the light conversion filter is housed in the optical evaluation apparatus and includes a phosphor.

2. The method of claim 1, wherein the specific color of light emitted from the light conversion filter comprises white light.

3. The method of claim 1, further comprising dispensing phosphor-containing resin prepared at the calculated mixing ratio around the LED chips classified into the same rank.

4. The method of claim 1, wherein the measuring of the at least one optical property comprises measuring chromaticity of the specific color of light,
   the classifying of each respective LED chip of the plurality of LED chips comprises classifying each respective LED chip of the plurality of LED chips into a plurality of ranks depending on the measured chromaticities of the specific color of light, and the calculating of the mixing ratio of phosphor-containing resin comprises calculating the mixing ratio of phosphor-containing resin to be applied in a resin application process depending on a particular rank of a particular LED chip, based on the preset correlation between the chromaticity of the specific color of light emitted from the light conversion filter when illuminated by the particular LED chip classified into the particular rank and chromaticity of the typical LED device emitting the specific color of light.

5. The method of claim 1, wherein the light conversion filter comprises a phosphor filter which converts the light emitted from each LED chip of the plurality of LED chips into different wavelengths of light, and emits the specific color of light.

6. The method of claim 5, wherein the phosphor filter comprises a transparent substrate and a phosphor layer formed on the transparent substrate.

7. The method of claim 5, wherein the phosphor filter comprises a phosphor plate or a phosphor film.

8. The method of claim 1, wherein the at least one optical property of the specific color of light emitted from the light conversion filter includes at least one of light quantity and spectrum.

9. A method for manufacturing an LED device, the method comprising the steps of:

measuring at least one optical property of a specific color of light obtained by converting light emitted from each respective LED chip of a plurality of LED chips through one same light conversion filter, wherein the one same light conversion filter containing a phosphor is disposed separated and apart from each respective LED chip of the plurality of LED chips during the measuring;

classifying each respective LED chip of the plurality of LED chips into a plurality of ranks depending on the at least one measured optical property of specific color of light emitted from the light conversion filter when illuminated by the respective LED chip; and calculating a mixing ratio of a phosphor-containing resin to be applied to a resin application process for LED chips classified in a same rank depending on the at least one measured optical property of the specific color of light emitted from the light conversion filter when illuminated by the LED chips classified into the same rank, based on a preset correlation between the at least one optical property of the specific color of light emitted from the light conversion filter when illuminated by the LED chips classified into the same rank and an optical property of a typical LED chip emitting the specific color of light.

10. The method of claim 9, wherein the light conversion filter is housed in an optical evaluation apparatus and includes a phosphor.

11. The method of claim 9, wherein the light emitted from each respective LED chip of the plurality of LED chips is blue light.

12. The method of claim 9, wherein the specific color of light emitted from the light conversion filter comprises white light.

13. The method of claim 9, further comprising dispensing the phosphor-containing resin prepared at the calculated mixing ratio around the plurality of LED chips.

14. The method of claim 9, wherein the measuring of the at least one optical property comprises measuring chromaticity of the specific color of light, and the calculating of the mixing ratio of the phosphor-containing resin comprises calculating the mixing ratio of the phosphor-containing resin to be applied to the resin application process depending on the measured chromaticity of the specific color of light emitted from the light conversion filter when illuminated by the LED chips classified into the same rank, based on a preset correlation between the chromaticity of the specific color of light emitted from the light conversion filter when illuminated by the LED chips classified into the same rank and chromaticity of the typical LED chip emitting the specific color of light.

15. The method of claim 9, wherein the light conversion filter comprises a phosphor filter which converts the light emitted from each LED chip of the plurality of LED chips into different wavelengths of light, and emits the specific color of light.

16. The method of claim 15, wherein the phosphor filter comprises a transparent substrate and a phosphor layer formed on the transparent substrate.

17. The method of claim 15, wherein the phosphor filter comprises a phosphor plate or a phosphor film.

18. The method of claim 9, wherein the at least one optical property of the specific color of light emitted from the light conversion filter includes at least one of light quantity and spectrum.

* * * * *